(12) United States Patent
Mitani et al.

(10) Patent No.: US 6,888,182 B2
(45) Date of Patent: May 3, 2005

(54) THIN FILM TRANSISTOR, METHOD FOR MANUFACTURING SAME, AND LIQUID CRYSTAL DISPLAY DEVICE USING SAME

(75) Inventors: Masahiro Mitani, Fukuyama (JP); Yasumori Fukushima, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 13 days.

(21) Appl. No.: 10/389,802

(22) Filed: Mar. 18, 2003

(65) Prior Publication Data

US 2003/0209737 A1 Nov. 13, 2003

(30) Foreign Application Priority Data

May 9, 2002 (JP) .......................................... 2002-134631

(51) Int. Cl.$^7$ ............................................. H01L 27/148
(52) U.S. Cl. ........................ 257/241; 257/240; 257/241; 257/243; 257/270; 257/286; 257/287; 438/147; 438/193; 438/195; 438/284
(58) Field of Search ................................. 257/241, 240, 257/243, 270, 286, 287; 438/147, 193, 195, 284

(56) References Cited

U.S. PATENT DOCUMENTS 5,989,940 A * 11/1999 Nakajima .................... 257/353
6,118,148 A * 9/2000 Yamazaki .................... 257/327
6,333,520 B1 * 12/2001 Inoue ........................... 257/72
6,498,376 B1 * 12/2002 Miyagi et al. ............... 257/392

FOREIGN PATENT DOCUMENTS

| JP | 06-123896 | 5/1994 |
|---|---|---|
| JP | 09-074205 | 3/1997 |
| JP | 11-097701 | 4/1999 |
| JP | 2003-308038 | 10/2003 |
| JP | 2003-308052 | 10/2003 |

* cited by examiner

*Primary Examiner*—Jerome Jackson
*Assistant Examiner*—Edgardo Ortiz
(74) *Attorney, Agent, or Firm*—Nixon & Vanderhye P.C.

(57) ABSTRACT

A thin film transistor of the present invention is provided with (i) a plurality of divided channel regions formed under a gate electrode, and (ii) divided source regions and divided drain regions between which each of the divided channel regions is sandwiched, the divided source regions being connected with one another, and the divided drain regions being connected with one another. Here, the divided channel regions are so arranged that a spacing between the divided channel regions is smaller than a channel divided width which is a width of one divided channel region, the channel divided width is not more than 50 $\mu$m, and the spacing is not less than 3 $\mu$m. With this arrangement, it is possible to provide a thin film transistor capable of obtaining reliability with reducing the variation in threshold voltage by reducing the self-heating at the channel regions, as well as capable of reducing the increase of a layout area.

14 Claims, 9 Drawing Sheets

THIN FILM TRANSISTOR, METHOD FOR MANUFACTURING SAME, AND LIQUID CRYSTAL DISPLAY DEVICE USING SAME

FIELD OF THE INVENTION

The present invention relates to a Thin Film Transistor (TFT) capable of preventing deterioration in characteristics; a method of manufacturing the same; and a liquid crystal display device using the same.

BACKGROUND OF THE INVENTION

In recent years, there is a growing demand for liquid crystal projectors as high definition display devices used for presentation, home theater, etc. The liquid crystal projector, which is a kind of a liquid crystal display device, is expected to be used widely as household devices such as a rear projection television, so that it is crucial for the liquid crystal projector to obtain reliability sufficient for consumer use.

In the liquid crystal projector, a TFT is used in a drive circuit section of a liquid crystal panel that composes the liquid crystal projector. Operation of the TFT, however, generates a variation in threshold voltage and a resultant lowering of driving current, thereby causing a serious problem in the reliability of the liquid crystal projector.

The variation in threshold voltage is deterioration of TFT characteristics. As a deterioration mode involving the variation in threshold voltage, known is deterioration due to heat generated by self-heating of the TFT. Depending on a product of a drain voltage Vd applied to the TFT and a drain current Id that flows the TFT during the operation, the variation in threshold voltage is presumably caused by the heat generated by the self-heating of the TFT.

The liquid crystal panel is generally composed of a display section for displaying an image and a driver circuit section for driving the display section. In recent years, a method has come to be used in which the display section and the driver circuit section are simultaneously formed on a transparent insulating substrate using poly-Si (polycrystalline silicon) having high mobility (driver monolithic type). In a liquid crystal panel formed by this method, a TFT used in the driver circuit section is surrounded by materials having low heat conductivity, such as a silicon oxide film composing a transparent insulating film and silicon dioxide composing the transparent insulating substrate. This makes it difficult for the TFT to dissipate the heat generated by the self-heating, resulting in that the deterioration of the TFT characteristics becomes more serious than ever.

In order to prevent the deterioration of the TFT characteristics, various TFTs capable of easily dissipating the heat have been suggested conventionally. Among them, Japanese Unexamined Patent Publication 97701/1999 (Tokukaihei 11-97701; published on Apr. 9, 1999) discloses an MOS (Metal Oxide Semiconductor) transistor in which (i) a plurality of (N) divided channel regions (having a total channel width Wt) are formed, and (ii) a spacing S between the divided channel regions is not smaller than a channel width W (W=Wt/N) of one of the divided channel regions. This realizes a structure capable of reducing the heat generation and capable of easily dissipating the heat. Hereinafter, the channel region that is divided is referred to as a divided channel region, and the channel width W of the divided channel region is referred to as a channel divided width.

However, in the conventional arrangement disclosed in the above publication, the spacing S that is not smaller than the channel divided width W is required between the divided channel regions, in order to prevent the deterioration of the TFT characteristics. This results in the driver circuit section having a very large layout area.

Figure 8:
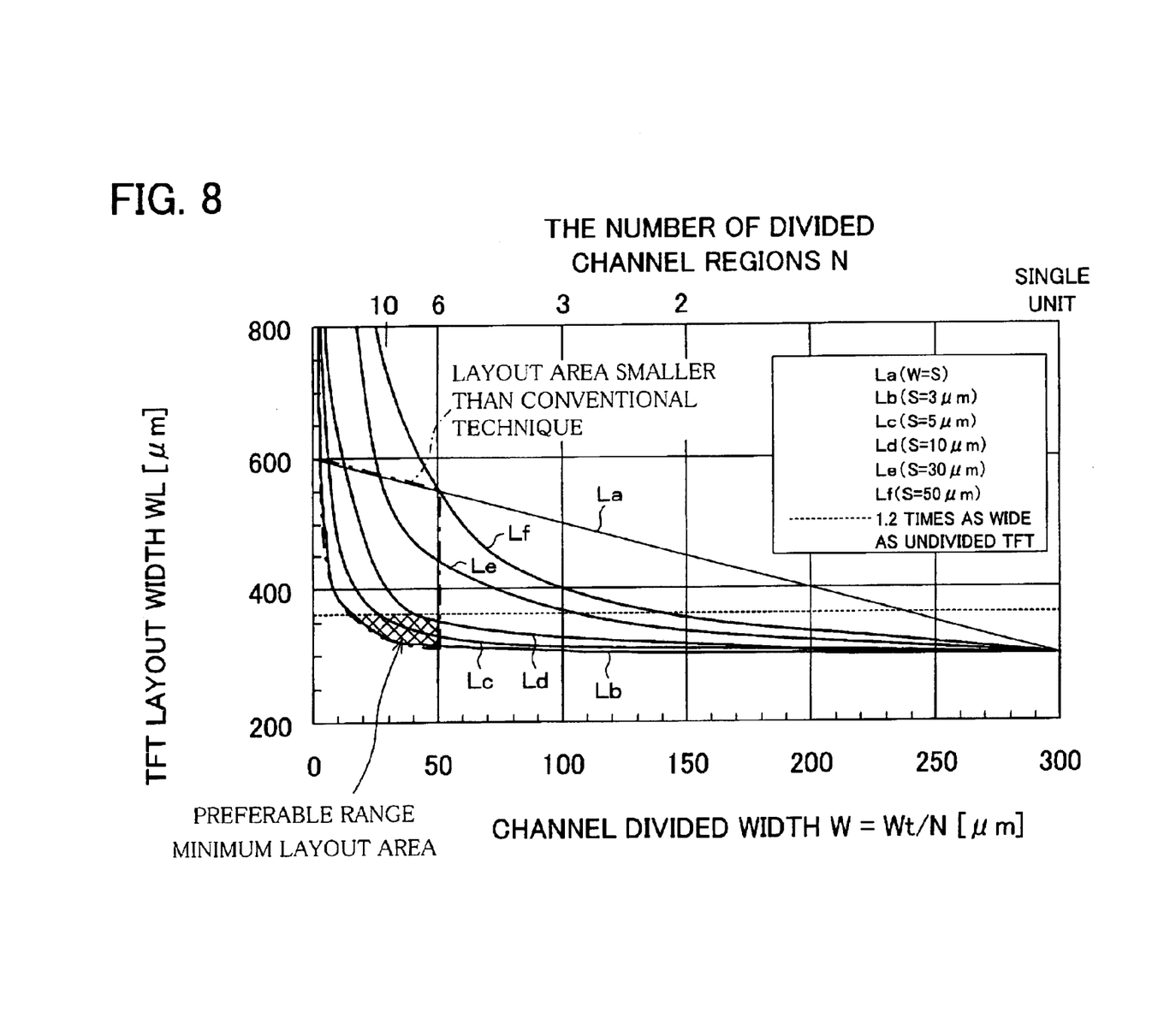
FIG. 8 is a graph showing a relation between a channel width of the divided channel region (channel divided width) and a TFT layout width, in a conventional example and the present invention.

In FIG. 8, a reference symbol La shows a relation between the channel divided width W and a layout width WL that is required for arranging the TFT, in a case where a single-unit TFT (whose channel region is not divided) having a total channel width Wt of 300 μm is so arranged that the channel region is divided into N, and a spacing S between the divided channel regions (hereinafter referred to as a channel spacing S) is the same as the channel divided width W, in accordance with the conventional arrangement.

The line La in FIG. 8 shows that, in the conventional arrangement, as the number N of divided channel regions increases (namely, as the channel divided width W decreases), the TFT layout width WL proportionally increases.

For example, the TFT layout width WL is 550 μm where W=S=50 μm, and 590 μm where W=S=10 μm. These TFTs thus require the layout area nearly twice as large as the layout area of the single-unit TFT having a total channel width Wt of 300 μm.

Consequently, in order to realize a layout of the driver circuit section with obtaining the above-described relation of the channel divided width W and the channel spacing S, without changing a size of the liquid crystal panel, namely without changing a size of the transparent insulating substrate, an area of the display section is narrowed. This consequently narrows a pixel pitch of the liquid crystal panel, thereby lowering an open area ratio.

On the other hand, in order to realize a layout of the driver circuit section with obtaining the above-described relation of the channel divided width W and the channel spacing S, without narrowing the pixel pitch and without lowering the open area ratio, the size of the liquid crystal panel inevitably increases.

As a result, in the above-described conventional arrangement, it is quite difficult to obtain both the TFT reliability and the retained open area ratio without increasing the size of the liquid crystal panel.

SUMMARY OF THE INVENTION

The object of the present invention is to provide a thin film transistor (TFT) capable of preventing the increase of a layout area without lowering reliability; a method of manufacturing the same; and a liquid crystal device using the same.

In order to attain the foregoing object, a thin film transistor of the present invention, including (i) a plurality of channel regions formed under a gate electrode, and (ii) source regions and drain regions between which each of the channel regions is sandwiched, the source regions being connected with one another, and the drain regions being connected with one another, is characterized in that the channel regions respectively have a channel width of not more than 50 μm, and a spacing between the channel regions is not less than 3 μm and is smaller than the channel width.

With this arrangement, by dividing the channel region of the thin film transistor (TFT) into a plural number, drain current Id that flows the respective channel regions (divided channel regions) can be reduced. This consequently reduces the self-heating at the respective channel regions, thereby reducing the variation in threshold voltage which is the deterioration of the TFT characteristics. Further, the source regions (divided source regions) are connected with one another, the drain regions (divided drain regions) are connected with one another, and a pair of each of the source regions and each of the drain regions sandwiches each of the channel regions. Therefore, the channel regions are connected in parallel with one another, so that the total amount of the drain current Id that flows each of the channel regions can be the same as the drain current Id of an undivided single-unit TFT.

Further, by setting the spacing between the channel regions (channel spacing) to be not less than 3 μm, the variation amount of the threshold voltage does not significantly differ from the variation amount of the threshold voltage where the spacing between the channel regions is the same as the channel width of one of the divided channel regions (channel divided width), namely where the spacing between the channel regions is 50 μm, as in the conventional arrangement.

Further, by setting the channel width of the divided channel region (channel divided width) to be not more than 50 μm, the variation amount of the threshold voltage of the TFT can be reduced to be not more than a half of the variation amount of the threshold voltage where the channel divided width is 150 μm.

Namely, the TFT is so arranged that the spacing between the channel regions (channel spacing) is smaller than the channel width of the channel region, with satisfying the conditions such that the spacing between the channel regions (channel spacing) is not less than 3 μm and the channel width of the channel region is not more than 50 μm. With this arrangement, without lowering the reliability of the TFT, it is possible to reduce the TFT layout width in comparison with the TFT layout width of the conventional arrangement in which the spacing between the channel regions is set to be the same as the channel width of the channel region (channel divided width), thereby reducing the increase of the TFT layout area due to the channel division.

In order to attain the foregoing object, a liquid crystal display device of the present invention, including a thin film transistor that has (i) a plurality of channel regions formed under a gate electrode, and (ii) source regions and drain regions between which each of the channel regions is sandwiched, the source regions being connected with one another, and the drain regions being connected with one another is characterized in that the channel regions respectively have a channel width of not more than 50 μm, and a spacing between the channel regions is not less than 3 μm and is smaller than the channel width.

With this arrangement, the TFT having the above-described features is used in the liquid crystal display device. Therefore, it is possible to provide a liquid crystal display device capable of obtaining the reliability as well as capable of minimizing the increase of an area of the liquid crystal display device without narrowing the pixel pitch and without lowering the open area ratio.

In order to attain the foregoing object, a method for manufacturing a thin film transistor of the present invention is characterized by including the steps of (A) forming a plurality of channel regions respectively having a channel width of not more than 50 μm, so that a spacing between the channel regions is not less than 3 μm and is smaller than the channel width, (B) forming source regions and drain regions between which each of the channel regions is sandwiched, (C) forming a gate electrode on the channel regions, and (D) connecting the source regions with one another, and connecting the drain regions with one another.

With this method, without lowering the reliability of the TFT of the conventional arrangement, it is possible to provide the TFT of the present invention capable of minimizing the increase of the TFT layout width due to the channel division, namely the increase from the layout width of the undivided single-unit TFT, thereby minimizing the increase of the TFT layout area due to the division.

For a fuller understanding of the nature and advantages of the invention, reference should be made to the ensuing detailed description taken in conjunction with the accompanying drawings.

BRIEF DESCRIPTION OF THE DRAWINGS

FIGS. 2(a) through 2(e) are cross-sectional views showing an example of manufacturing steps of a thin film transistor of the present invention. FIG. 2(e) is a cross-sectional view taken on line A—A of FIG. 1.

DESCRIPTION OF THE EMBODIMENTS

As a result of diligent work of the inventors of the present invention, the inventors have found that, in order to obtain the effect of preventing the deterioration of a thin film transistor (TFT) having a plurality of divided channel regions, a spacing S that is not smaller than a channel divided width W (channel width per divided channel region) is not necessarily required between the plurality of divided channel regions, as disclosed in Tokukaihei 11-97701. The following will explain this in detail.

Figure 6:
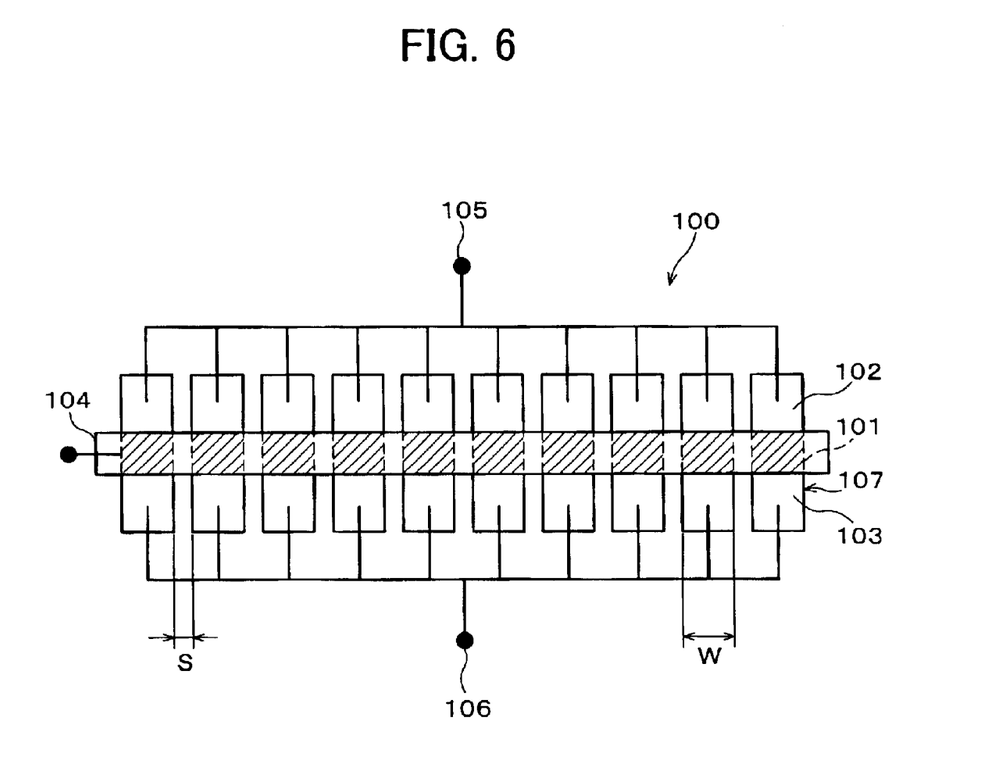
FIG. 6 is a plan view showing a thin film transistor used in experiments of the present invention.

The inventors of the present invention prepared TFTs 100, respectively having an arrangement as shown in FIG. 6, so as to have a different channel spacing S from one another, and then applied stress on the TFTs 100 for a predetermined time in a constant stress condition to generate self-heating (where a gate voltage Vg and a drain voltage Vd are both high, namely, where Vg=Vd=about 10 V to 20 V). They measured a resultant variation in threshold voltage of the TFT, thereby researching a relation between the spacing S and the variation in threshold voltage.

In the TFT 100, as shown in FIG. 6, under a gate electrode 104 in a long sheet shape, N (ten in FIG. 6) divided channel regions 101 (shaded portions in FIG. 6) respectively having the channel divided width W are formed so that the spacing S is provided between the divided channel regions 101. Divided source regions 102 and divided drain regions 103 are formed so as to sandwich each of the divided channel regions 101 in a direction orthogonal to a channel width direction, namely, in a channel divided direction. The divided source regions 102, the divided drain regions 103, and the divided channel regions 101 are composed of semiconductor layers 107 that are patterned into island shapes. The semiconductor layers 107 are formed in accordance with the number of the divided channel regions. The respective divided source regions 102 are connected to a common source electrode 105, whereas the respective divided drain regions 103 are connected to a common drain electrode 106.

Figure 7:
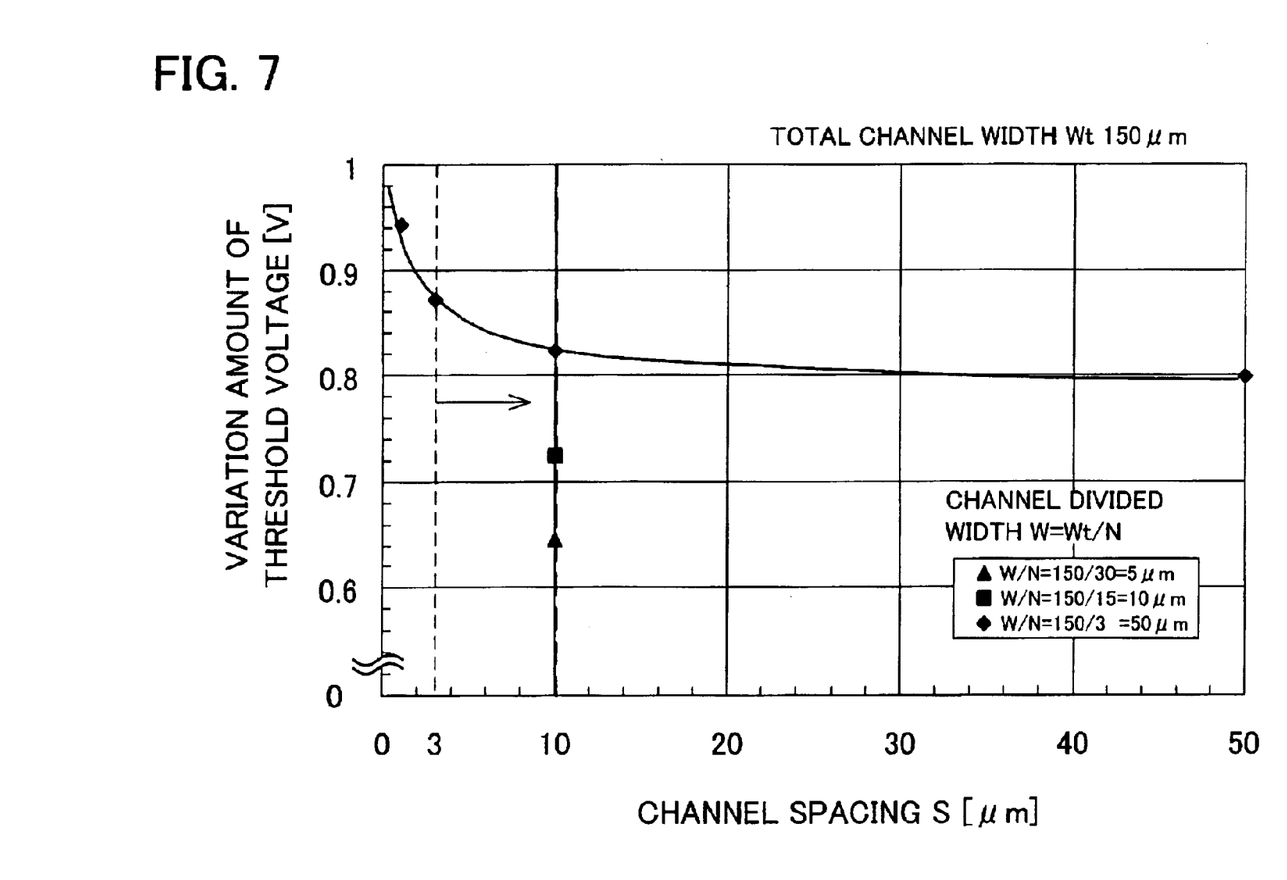
FIG. 7 is a graph showing a relation between (X) a spacing between divided channel regions and (Y) a variation amount of a threshold voltage, where the number of divided channel regions is N.

FIG. 7 is research results of a relation between the channel spacing S and the variation in threshold voltage. Here, a variation amount of the threshold voltage Vth is obtained by subtracting a threshold voltage Vth in an initial state from a threshold voltage Vth after subjected to the stress.

As shown in FIG. 7, when a total channel width Wt of 150 μm is divided into three (N=3), the channel divided width W is 50 μm. In this case, by setting the channel spacing S to be not less than 3 μm, the variation amount of the threshold voltage Vth does not significantly differ from the variation amount of the threshold voltage Vth where the channel spacing S is the same as the channel divided width W, namely where the channel spacing S is 50 μm (=W), which is a minimum requirement for the conventional arrangement. Namely, in order to easily dissipate the heat so as to prevent the TFT deterioration, the channel spacing S is not necessarily required to be not less than the channel divided width W.

FIG. 7 also shows that, when the channel spacing S is constant (S=10 μm), the variation amount of the threshold voltage Vth can be reduced by narrowing the channel divided width W.

A silicon oxide film and silicon dioxide on which the TFT 100 is formed have thermal conductivity of approximately 0.014 W/K·cm. On the other hand, silicon forming the semiconductor layer 107 has thermal conductivity of approximately 1.5 W/K·cm, and metal wiring layers (made of AlSi, for example) composing the source electrode 105 and the drain electrode 106 have thermal conductivity of approximately 2.4 W/K·cm. Namely, the thermal conductivity of the semiconductor layer 107 and the metal wiring layers are over hundred times as high as the thermal conductivity of the silicon oxide film and the silicon dioxide. This draws the conclusion that the heat generated by the self-heating is not dissipated via the surrounding silicon oxide film and silicon dioxide as assumed in the publication, but is dissipated via the divided source regions 102 and the divided drain regions 103, as well as the source electrode 105 and the drain electrode 106 connected to the divided source regions 102 and the divided drain regions 103, which have higher thermal conductivity. As a result, as shown in FIG. 7, it is assumed that the large channel spacing S is not so effective to prevent the variation in TFT characteristics.

Further, FIG. 8 shows research results of a relation between the channel divided width W and a TFT layout width WL, with respect to the channel spacing S. Lines Lb through Lf show the relations where the channel spacing S is 3 μm, 5 μm, 10 μm, 30 μm, and 50 μm, respectively.

When the channel spacing S is 3 μm, as indicated by the line Lb, the TFT layout width WL required for the total channel width Wt of 300 μm does not significantly increase in accordance with the decrease of the channel divided width W until the channel divided width W becomes approximately 30 μm. This shows that the increase of the TFT layout area can be remarkably reduced in comparison with the conventional arrangement where the channel spacing S is not less than the channel divided width W.

Further, the inventors of the present invention prepared TFTs 100, respectively having the above-described arrangement, so as to have a different channel divided width W from one another, and then applied stress on the TFTs 100 for a predetermined time in a constant stress condition to generate the self-heating (where the gate voltage Vg and the drain voltage Vd are both high, namely, where Vg=Vd= about 10 V to 20 V). They measured a resultant variation in threshold voltage Vth of the TFT 100, thereby researching a relation between the channel divided width W and the variation in threshold voltage Vth. The results are shown in FIG. 9.

Figure 9:
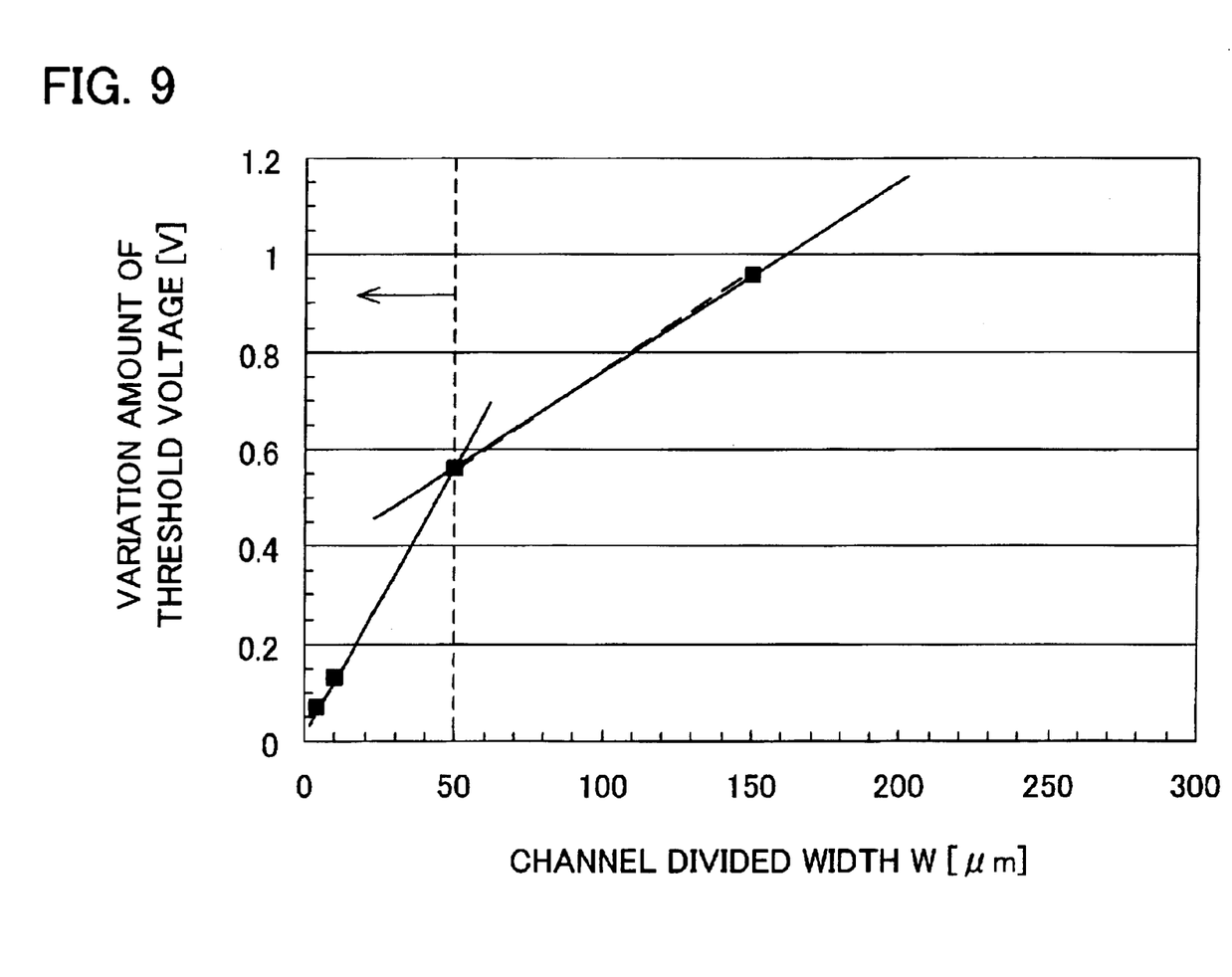
FIG. 9 is a graph showing a channel width of the divided channel region (channel divided width) and a variation amount of a threshold voltage.

FIG. 9 shows that, by setting the channel divided width W to be not more than 50 μm, the variation amount of the threshold voltage Vth can be reduced to be not more than a half of the variation amount of the threshold voltage Vth where the channel divided width W is 150 μm.

As described above, the chain line in FIG. 8 specifies an area, where (1) the channel spacing S is smaller than the channel divided width W, (2) the channel divided width W is not more than 50 μm, and (3) the channel spacing S is not less than 3 μm. According to this setting, without lowering the reliability of the TFT, it is possible to reduce the TFT layout width in comparison with the TFT layout width of the conventional arrangement in which the channel spacing S is set to be the same as the channel divided width W, thereby reducing the increase of the TFT layout area due to the channel division.

The cross-hatching in FIG. 8 indicates an area where (1) the channel divided width W is from 10 μm to 50 μm, (2) the channel spacing S is from 3 μm to 10 μm, and (3) the layout width WL of the TFT 20 is not more than 1.2 times as large as a layout width WL$_0$ of an undivided single-unit TFT. According to this setting, without lowering the reliability of the TFT, it is possible to minimize the increase of the TFT layout width due to the channel division, namely the increase from the layout width of the undivided single-unit TFT, thereby minimizing the increase of the TFT layout area due to the channel division.

Based on the above-described results, the following will explain an embodiment of the present invention.

Figure 1:
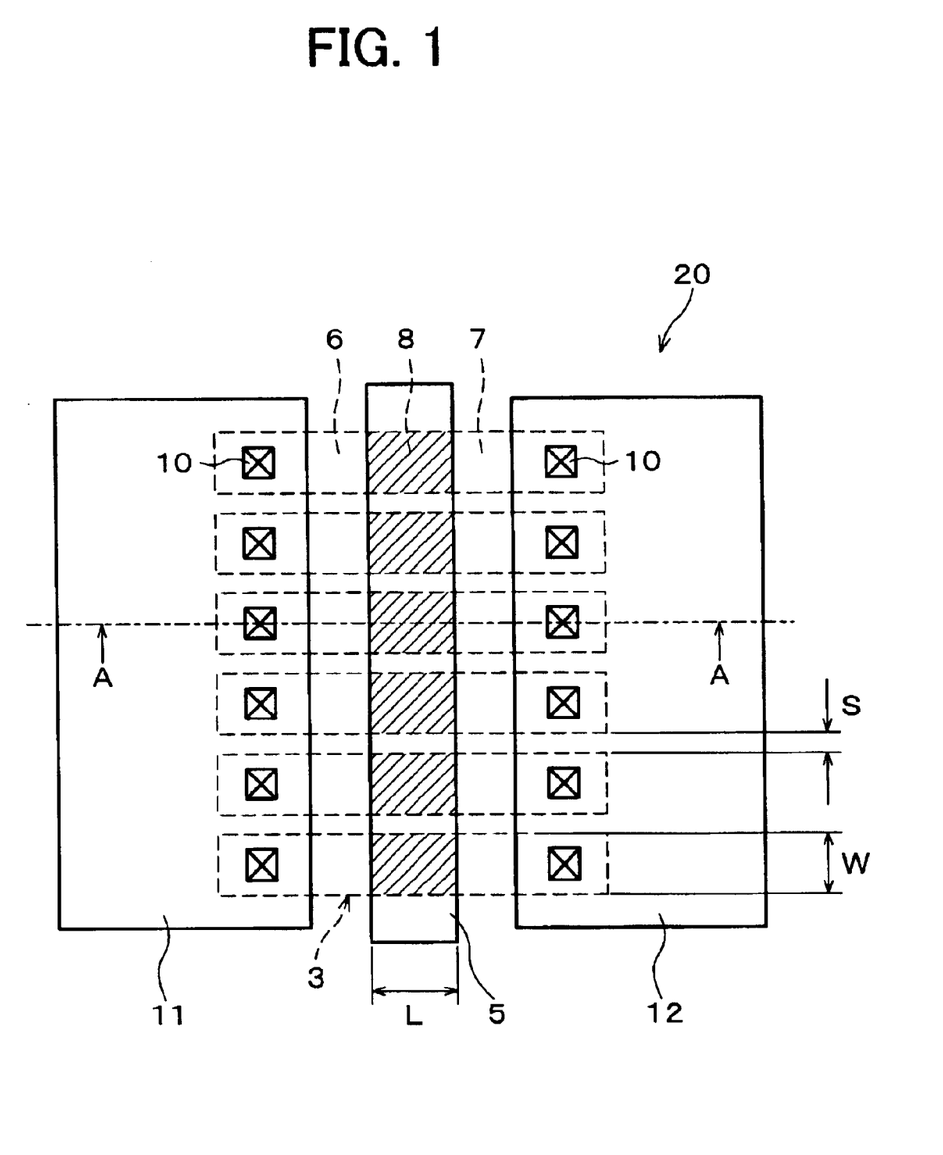
FIG. 1 is a plan view showing an example of an arrangement of a thin film transistor of the present invention.

FIG. 1 shows a concept of the TFT 20 of an embodiment of the present invention. Note that, FIG. 1 corresponds to a top plan view of the TFT 20, but FIG. 1 only shows a concept, and thus the descriptions of an insulating substrate, an insulation film, etc., on which the TFT 20 is formed, are omitted here.

The TFT 20 is formed in such a manner that, in a single-unit TFT having a total channel width Wt, the channel region is divided into N in a channel width direction.

Under a gate electrode 5 in a long sheet shape, a plurality of divided channel regions (channel regions) 8 (shaded portions in FIG. 1) respectively having a channel divided width W of Wt/N are formed. Divided source regions (source regions) 6 and divided drain regions (drain regions) 7 are formed so as to sandwich each of the divided channel regions 8 in a direction orthogonal to an aligned direction of the divided channel regions 8 (channel width direction). The divided source regions 6 and the divided drain regions 7 are composed of semiconductor layers 3 that are patterned into island shapes. The semiconductor layers 3 are formed in accordance with the number of the divided channel regions.

Each of the divided source regions 6 is connected to a common source electrode (metal wiring layer) 11 via a contact hole 10. Likewise, each of the divided drain regions 7 is connected to a common drain electrode (metal wiring layer) 12 via a contact hole 10.

Thus, the TFT 20 has a transistor structure in which six MOS transistors respectively having a channel width (channel divided width) W are connected in parallel; namely, a transistor structure in which a TFT having a channel width Wt is divided into six in the channel width direction.

With this arrangement, by dividing the channel region 8 into a plural number (N) and by narrowing the channel divided width W, drain current Id that flows the respective divided channel regions 8 can be reduced. This consequently reduces the heat generation at the respective channel regions 8, thereby preventing the deterioration of the TFT characteristics.

Further, the divided channel regions 8 are connected in parallel with one another, so that the total amount of the drain current Id that flows each of the divided channel regions 8 can be the same as the drain current Id of the undivided single-unit TFT.

Further, the TFT 20 is so arranged that the spacing between the channel divided regions (channel spacing) S is smaller than the channel divided width W, the channel divided width W is not more than 50 $\mu$m, and the channel spacing S is not less than 3 $\mu$m.

With this, the TFT 20 is capable of minimizing the increase of the TFT layout area, without lowering the reliability.

The TFT 20 is more preferably designed so that the channel divided width W is from 10 $\mu$m to 50 $\mu$m, the channel spacing S is from 3 $\mu$m to 10 $\mu$m, and the layout width WL of the TFT 20 is not more than 1.2 times as the layout width $WL_0$ of the undivided single-unit TFT.

With this, without lowering the reliability of the TFT of the conventional arrangement, it is possible to minimize the increase of the TFT layout width due to the channel division, namely the increase from the layout width of the undivided single-unit TFT, thereby minimizing the increase of the TFT layout area due to the channel division.

Incidentally, in forming the divided channel regions, optimum values of the channel divided width W and the channel spacing S may be set in accordance with a degree of reliability required for the TFT 20.

In view of three respects such that (1) the variation amount of the threshold voltage significantly decreases in the range where the channel divided width W is not more than 50 $\mu$m, as shown in FIG. 9, (2) the variation amount of the threshold voltage does not significantly change in the range where the channel spacing S is not less than 3 $\mu$m, as shown in FIG. 7, and (3) the divided TFT layout width WL should be limited so as not to reduce the open area ratio compared with the TFT layout width WL (300 $\mu$m) of the undivided single-unit TFT, as shown in FIG. 8, it is more preferable that the channel divided width W is approximately from 30 $\mu$m to 50 $\mu$m, and the channel spacing S is approximately from 3 $\mu$m to 10 $\mu$m.

Further, in view of respects such that the variation amount of the threshold voltage Vth does not significantly change in the range where the channel spacing S is not less than 3 $\mu$m, as shown in FIG. 7, and the divided TFT layout width WL should be smaller than that of the conventional arrangement, lower limits of the channel divided width W and the channel spacing S are both approximately 3 $\mu$m.

Incidentally, an LDD (Lightly Doped Drain) structure wherein a low impurity region is respectively provided between the channel regions and the source and drain regions, a GOLD (Gate Overlapped LDD) structure wherein the low impurity region is provided so as to overlap the gate electrode, and a multi-gate structure wherein a plurality of gate electrodes are provided between the source regions and the drain regions are generally known to be effective on deterioration of the TFT characteristics due to hot carriers, but have no effect on the deterioration of the TFT characteristics due to the self-heating. Therefore, in the arrangement of the TFT 20, by combining the LDD structure, the GOLD structure, or the multi-gate structure with the division of the channel region width, it is possible to prevent both the deterioration modes due to the hot carriers and the self-heating.

Figure 5:
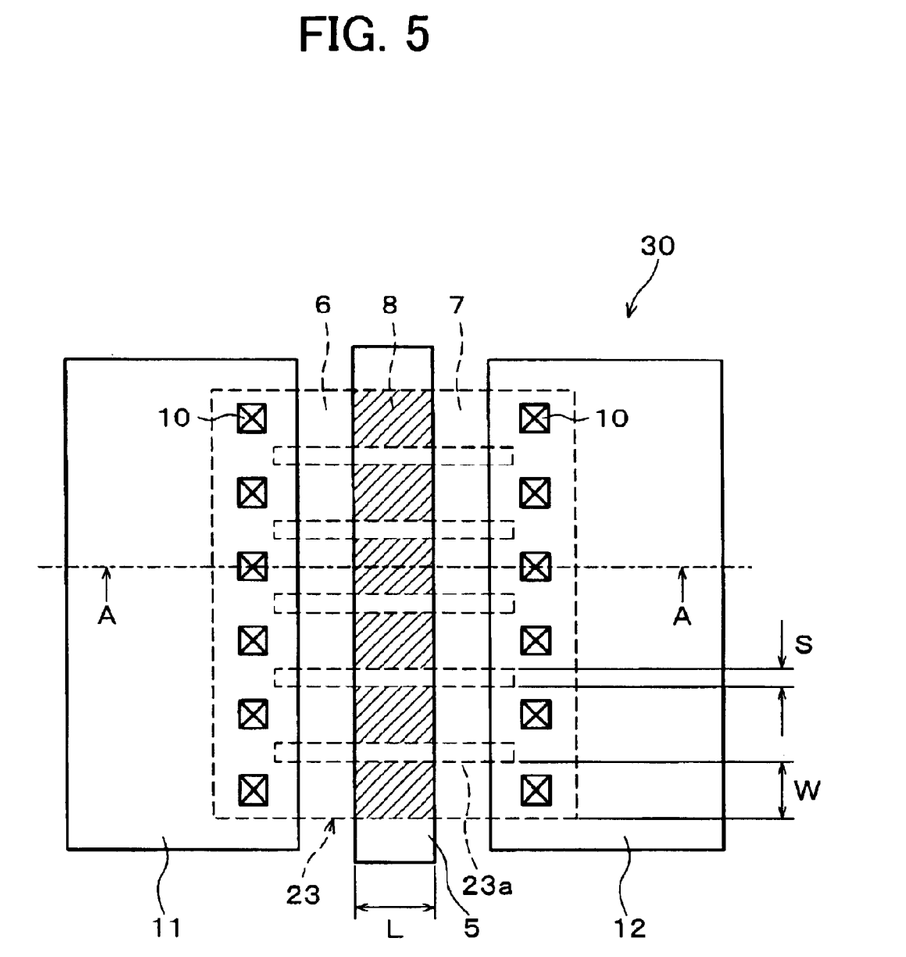
FIG. 5 is a plan view showing an example of an arrangement of yet another thin film transistor of the present invention.

FIG. 5 shows a concept of a TFT 30 of another embodiment of the present invention. Note that, FIG. 5 corresponds to a top plan view of the TFT 30, but FIG. 5 only shows a concept, and thus the descriptions of an insulating substrate, an insulation film, etc., on which the TFT 30 is formed, are omitted here.

The TFT 30 is the same as the TFT 20 of FIG. 1 except the semiconductor layer 23 which composes the plurality of divided channel regions 8, the plurality of divided source regions 6, and the plurality of divided drain regions 7. In the TFT 20 of FIG. 1, the N semiconductor layers 3 are formed in accordance with the N divided channel regions 8. Further, the respective divided source regions 6 as well as the respective divided drain regions 7 are provided separately from one another, in accordance with the respective divided channel regions 8. Further, the respective divided source regions 6 are connected with one another through the source electrode 11 which is connected to the respective divided source regions 6 via the contact hole 10. Likewise, the respective divided drain regions 7 are connected with one another through the drain electrode 12 which is connected to the respective divided drain regions 7 via the contact hole 10.

In contrast, in the TFT 30 of FIG. 5, the semiconductor layer 23 is not divided into N in accordance with the respective divided channel regions, but a single semiconductor layer. By forming a slit-shaped opening 23a along a channel length direction L orthogonal to the channel width direction, only the channel region is divided to form the divided channel regions 8. Thus, the respective divided source regions 6 are connected with one another on the opposite side of the divided channel regions 8, and the respective divided drain regions 7 are connected with one another on the opposite side of the divided channel regions 8.

Note that, the arrangement except the semiconductor layer 23, as well as the functions and effects, of the TFT 30 are the same as those of the TFT 20 of FIG. 1.

EXAMPLE 1

Figure 2:
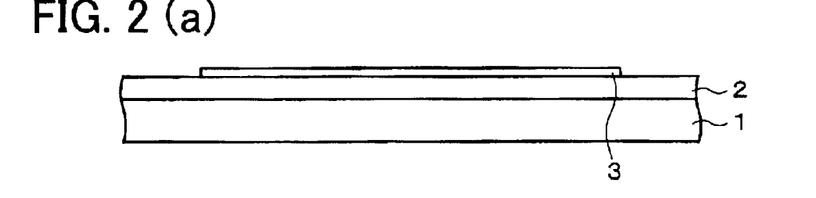

The following will explain an example of the TFT 20 of FIG. 1, with reference to FIGS. 1, 2(*a*) through 2(*e*). Here, a single gate structure is combined with the division of the channel region width.

FIG. 2(*e*) is a cross-sectional view of a TFT in which the single gate structure is adopted in the arrangement of the TFT 20, corresponding to a cross-sectional view taken on line A—A of FIG. 1. The TFT is an NMOS transistor used for a driving circuit element of a liquid crystal display device, for example.

In the TFT, on an entire top surface of a transparent insulating substrate 1 made of silicon dioxide, etc., a first interlayer insulating film having a thickness of approximately 200 μm to 500 μm is formed with an insulating film such as silicon oxide ($SiO_2$) and HTO (High Temperature Oxide).

On the first interlayer insulating film 2, a plurality of (six, in this example) divided semiconductor layers 3 respectively having a thickness of approximately 50 nm to 150 nm are formed with amorphous silicon, polycrystalline silicon, single-crystal silicon, etc. Further, each of the semiconductor layers 3 is composed of a divided channel region 8 at the center, and a divided source region 6 and a divided drain region 7, which are high impurity diffused regions, sandwiching the divided channel region 8.

On an entire top surface of the first interlayer insulating film 2 having the semiconductor layers 3, a gate insulating film 4 having a thickness of approximately 100 nm is formed with silicon oxide, etc. On the gate insulating film 4, a gate electrode 5 having a thickness of approximately 300 nm is formed with an electrical conductor such as WSi, etc. so as to cross the respective divided channel regions 8. On an entire top surface of the gate insulating film 4 having the gate electrode 5, a second interlayer insulating film 9 having a thickness of approximately 600 nm is formed with silicon oxide, etc.

Further, on the gate insulating film 4 and the second interlayer insulating film 9, contact holes 10 are formed for taking out the electrodes. Through each of the contact holes 10, the respective divided source regions 6 are connected to a common source electrode 11 which is a metal wiring layer made of a metal material such as Al, and the respective divided drain regions 7 are connected to a common drain electrode 12 which is a metal wiring layer made of a metal material such as Al.

Next, the manufacturing steps of the TFT of the above-explained example will be explained with reference to cross-sectional views of FIGS. 2(a) through 2(e).

① An insulating film such as silicon oxide and HTO is deposited on the transparent insulating substrate 1 made of silicon dioxide, etc., so as to form the first interlayer insulating film 2 as shown in FIG. 2(a). The first interlayer insulating film 2 has a thickness of approximately 200 nm through 500 nm.

② Next, as shown in FIG. 2(a), the semiconductor layer 3 is formed on the first interlayer insulating film 2. The semiconductor layer 3 is composed of amorphous silicon, polycrystalline silicon, and single-crystal silicon, for example. When the polycrystalline silicon is formed, for example, an amorphous silicon thin film is deposited to have a thickness of approximately 50 nm through 150 nm on the first interlayer insulating film 2 by a low pressure chemical vapor deposition (LPCVD) method, and then poly-crystallized by means of high temperature heat treatment or laser annealing.

③ Patterning is carried out in a photolithography step and an etching step, so as to form a plurality of (six) semiconductor layers 3 (see FIG. 1). Following this, if necessary, impurities for transistor threshold control may be implanted.

④ As shown in FIG. 2(b), the gate insulating film 4 is formed with silicon oxide on the semiconductor layer 3. The gate insulating film 4 is formed by means of deposition by a CVD (Chemical Vapor Deposition) method or by means of oxidation by heat treatment. The gate insulating film 4 has a thickness of approximately 100 nm.

⑤ Following this, as shown in FIG. 2(b), the gate electrode 5 is formed on the gate insulating film 4. The gate electrode 5 is formed in a manner such that a film such as WSi is formed to have a thickness of approximately 300 nm by the CVD method, for example, and then predetermined patterning is applied. In the present example, one gate electrode 5 is patterned to have the single gate structure (see FIG. 1).

⑥ Using the gate electrode 5 as a mask, n-type high impurities (phosphorus, arsenic, etc.) are implanted in the semiconductor layer 3 at a dose amount of 1 to $5\times10^{15}/cm^2$, so as to form the divided source region 6 and the divided drain region 7 which are high impurity regions, as shown in FIG. 2(c). A portion under the gate electrode 5 becomes the divided channel region 8. Following this, annealing is carried out for ion activation.

⑦ An insulating film is deposited for approximately 600 nm on the entire top surface of the gate insulating film 4 having the gate electrode 5, so as to form the second interlayer insulating film 9, as shown in FIG. 2(d).

⑧ As shown in FIG. 2(e), contact holes 10 for taking out the electrodes are respectively formed on the divided source region 6 and on the divided drain region 7.

⑨ A metal material such as Al is formed into a film and patterned into a predetermined shape, so as to form the source electrode 11 and the drain electrode 12, as shown in FIG. 2(e).

With the above-described steps of ① through ⑨, the TFT of the present invention, which is an NMOS transistor, is manufactured.

Note that, in order to realize the single gate structure, one gate electrode 5 is patterned here. However, for a multi-gate structure, a plurality of gate electrodes 5 may be patterned in the step of ⑤. Further, the NMOS transistor is described here as an example, but a PMOS transistor can be manufactured in the same method except that the element for impurity ion implantation is p-type impurities (such as boron).

Further, the TFT 30 in which the divided source regions 6 are respectively connected with one another via the semiconductor layer 23 and the divided drain regions 7 are respectively connected with one another via the semiconductor layer 23, as shown in FIG. 5, may be formed in the same manner except that the semiconductor layer 23 is patterned to have a different shape in the step of ③.

EXAMPLE 2

The following will explain another example of the TFT 20 as shown in FIG. 1, with reference to FIGS. 1, 3(a), and 3(b). Here, the LDD structure is combined with the division of the channel region width.

In the TFT of the present example, the LDD structure is adopted in the arrangement of the TFT 20. The TFT is an NMOS transistor used for a driving circuit element of a liquid crystal display device, for example.

The TFT of the present example having the LDD structure differs from the TFT of example 1 in that a low impurity region is provided between the divided source regions 6 and the divided channel regions 8, and between the divided drain regions 7 and the divided channel regions 8 (see FIG. 3(b)). By using the LDD structure, the electric field intensity is reduced between the channel and the drain, thereby achieving an effect of reducing the deterioration of the TFT characteristics due to hot carriers.

The manufacturing steps of the TFT 20 having the LDD structure, which is an NMOS transistor here, will be explained with reference to FIGS. 3(*a*) and 3(*b*), together with FIGS. 2(*a*) through 2(*e*). Note that, FIGS. 3(*a*) and 3(*b*) are cross-sectional views, corresponding to the cross-sectional view taken on line A—A of FIG. 1, which show some manufacturing steps of the TFT of the present example.

First, as shown in FIGS. 2(*a*) and 2(*b*), the steps ① through ⑤ in Example 1 are carried out.

Figure 3:
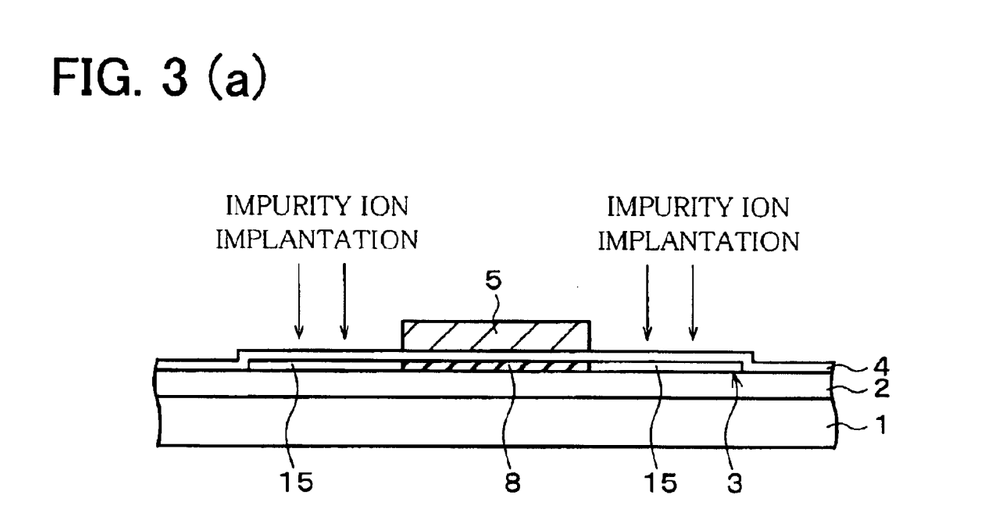
FIGS. 3(a) and 3(b) are cross-sectional views showing an example of manufacturing steps of another thin film transistor of the present invention.

Next, using the gate electrode 5 as a mask, n-type low impurities (phosphorus, arsenic, etc.) are implanted in the semiconductor layer 3 at a dose amount of $5 \times 10^{12}$ to $1 \times 10^{14}/\text{cm}^2$, so as to form low impurity regions 15, as shown in FIG. 3(*a*). A portion under the gate electrode 5 where the impurities are not implanted becomes the divided channel region 8.

Following this, the photo resist 14 is patterned. Then, n-type high impurities (phosphorus, arsenic, etc.) are implanted in the low impurity regions 15 of the semiconductor layer 3 at a dose amount of 1 to $5 \times 10^{15}/\text{cm}^2$, so as to form the divided source region 6 and the divided drain region 7 which are high impurity regions, as shown in FIG. 3(*b*). After the photo resist 14 is separated, annealing is carried out for ion activation.

Then, as shown in FIGS. 2(*d*) and 2(*e*), the steps ⑦ through ⑨ in Example 1 are carried out.

With the above-described steps, the TFT of the present invention having the LDD structure, which is an NMOS transistor, is manufactured.

Note that, a PMOS transistor can be manufactured in the same method except that the element for impurity ion implantation is p-type impurities (such as boron). Further, the TFT 30 in which the divided source regions 6 are respectively connected with one another via the semiconductor layer 23 and the divided drain regions 7 are respectively connected with one another via the semiconductor layer 23, as shown in FIG. 5, may be formed in the same manner except that the semiconductor layer 23 is patterned to have a different shape in the step of ③.

EXAMPLE 3

Figure 4:
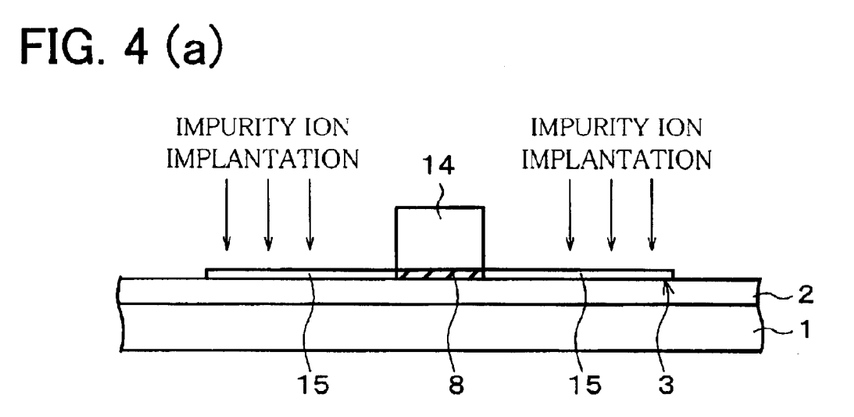
FIGS. 4(a) through 4(c) are cross-sectional views showing an example of manufacturing steps of a further thin film transistor of the present invention.

The following will explain a further example of the TFT 20 as shown in FIG. 1, with reference to FIGS. 1, and 4(*a*) through 4(*c*). Here, the GOLD structure is combined with the division of the channel region width.

In the TFT of the present example, the GOLD structure is adopted in the arrangement of the TFT 20. The TFT is an NMOS transistor used for a driving circuit element of a liquid crystal display device, for example.

The TFT of the present example having the GOLD structure differs from the TFT of example 1 in that an overlap region 15*a* and an offset region 15*b* which are low impurity regions 15 are provided between the divided source regions 6 and the divided channel regions 8, and between the divided drain regions 7 and the divided channel regions 8 (see FIG. 4(*c*)). By using the GOLD structure, the electric field intensity is reduced between the channel and the drain, thereby achieving an effect of reducing the deterioration of the TFT characteristics due to hot carriers.

The manufacturing steps of the TFT 20 having the GOLD structure, which is an NMOS transistor here, will be explained with reference to FIGS. 4(*a*) through 4(*c*), together with FIGS. 2(*a*) through 2(*e*). Note that, FIGS. 4(*a*) through 4(*c*) are cross-sectional views, corresponding to the cross-sectional view taken on line A—A of FIG. 1, which show some manufacturing steps of the TFT of the present example.

First, as shown in FIGS. 2(*a*), the steps ① and ② in Example 1 are carried out.

Next, the photo resist 14 is patterned. Then, n-type low impurities (phosphorus, arsenic, etc.) are implanted in the semiconductor layer 3 at a dose amount of $5 \times 10^{12}$ to $1 \times 10^{14}/\text{cm}^2$, so as to form the low impurity regions 15, as shown in FIG. 4(*a*). A portion covered with the photo resist 14 where the impurities are not implanted becomes the divided channel region 8.

After the photo resist 14 is separated, the gate electrode 5 is formed on the gate insulating film 4, as shown in FIG. 4(*b*), so as to partly overlap the low impurity regions 15. Note that, after the gate electrode 5 is formed, n-type low impurities may be implanted in the low impurity regions 15, using the gate electrode 5 as a mask, for drain current adjustment.

Following this, the photo resist 14 is patterned. Then, n-type high impurities (phosphorus, arsenic, etc.) are implanted in the semiconductor layer 3 at a dose amount of 1 to $5 \times 10^{15}/\text{cm}^2$, so as to form the divided source region 6 and the divided drain region 7 which are high impurity regions, as shown in FIG. 4(*c*). With this, the low impurity region 15 is composed of an overlap region 15*a* under the gate electrode 5 and an offset region 15*b* which is not under the gate electrode 5. After the photo resist 14 is separated, annealing is carried out for impurity ion activation.

Then, as shown in FIGS. 2(*d*) and 2(*e*), the steps ⑦ through ⑨ in Example 1 are carried out.

With the above-described steps, the TFT of the present invention having the GOLD structure, which is an NMOS transistor, is manufactured.

Note that, a PMOS transistor can be manufactured in the same method except that the element for impurity ion implantation is p-type impurities (such as boron). Further, the TFT 30 in which the divided source regions 6 are respectively connected with one another via the semiconductor layer 23 and the divided drain regions 7 are respectively connected with one another via the semiconductor layer 23, as shown in FIG. 5, may be formed in the same manner except that the semiconductor layer 23 is patterned to have a different shape in the step of ③.

As described above, a thin film transistor of the present invention, including (i) a plurality of channel regions formed under a gate electrode, and (ii) source regions and drain regions between which each of the channel regions is sandwiched, the source regions being connected with one another, and the drain regions being connected with one another, is so arranged that the channel regions respectively have a channel width of not more than 50 $\mu$m, and a spacing between the channel regions is not less than 3 $\mu$m and is smaller than the channel width.

With this arrangement, by dividing the channel region of the thin film transistor (TFT) into a plural number, drain current Id that flows the respective channel regions (divided channel regions) can be reduced. This consequently reduces the self-heating at the respective channel regions, thereby reducing the variation in threshold voltage which is the deterioration of the TFT characteristics. Further, the source regions (divided source regions) are connected with one another, the drain regions (divided drain regions) are connected with one another, and a pair of each of the source regions and each of the drain regions sandwiches each of the channel regions. Therefore, the channel regions are connected in parallel with one another, so that the total amount of the drain current Id that flows each of the channel regions can be the same as the drain current Id of an undivided single-unit TFT.

Further, by setting the spacing between the channel regions (channel spacing) to be not less than 3 µm, the variation amount of the threshold voltage does not significantly differ from the variation amount of the threshold voltage where the spacing between the channel regions is the same as the channel width of one of the divided channel regions (channel divided width), namely where the spacing between the channel regions is 50 µm, as in the conventional arrangement.

Further, by setting the channel width of the divided channel region (channel divided width) to be not more than 50 µm, the variation amount of the threshold voltage of the TFT can be reduced to be not more than a half of the variation amount of the threshold voltage where the channel divided width is 150 µm.

Namely, the TFT is so arranged that the spacing between the channel regions (channel spacing) is smaller than the channel width of the channel region, with satisfying the conditions such that the spacing between the channel regions (channel spacing) is not less than 3 µm and the channel width of the channel region is not more than 50 µm. With this arrangement, without lowering the reliability of the TFT, it is possible to reduce the TFT layout width in comparison with the TFT layout width of the conventional arrangement in which the spacing between the channel regions is set to be the same as the channel width of the channel region (channel divided width), thereby reducing the increase of the TFT layout area due to the channel division.

The thin film transistor of the present invention is preferably arranged so that the channel width is from 10 µm to 50 µm, the spacing between the channel regions is from 3 µm to 10 µm, and $WL \leq WL_0 \times 1.2$ is satisfied, where WL is a layout width of the thin film transistor and $WL_0$ is a layout width of a thin film transistor whose channel region has a total size of the channel widths of the respective channel regions (single-unit TFT).

With this arrangement, without lowering the reliability of the TFT of the conventional arrangement, it is possible to minimize the increase of the TFT layout width due to the channel division, namely the increase from the layout width of the undivided single-unit TFT, thereby minimizing the increase of the TFT layout area due to the division.

The thin film transistor of the present invention may be so arranged that the source regions are connected with one another via a semiconductor layer that composes the source regions, and the drain regions are connected with one another via a semiconductor layer that composes the drain regions. Alternatively, the thin film transistor of the present invention may be so arranged that the source regions are connected with one another via a wiring layer (source electrode) that is connected to the source regions, and the drain regions are connected with one another via a wiring layer (drain electrode) that is connected to the drain regions.

The thin film transistor of the present invention may have an LDD (Lightly Doped Drain) structure, a GOLD (Gate Overlapped LDD) structure, or a multi-gate structure.

With this arrangement, the TFT has an LDD (Lightly Doped Drain) structure wherein a low impurity region is respectively provided between the channel regions and the source and drain regions, a GOLD (Gate Overlapped LDD) structure wherein the low impurity region is provided so as to overlap the gate electrode, or a multi-gate structure wherein a plurality of gate electrodes are provided between the source regions and the drain regions. These structures are generally known to be effective on deterioration of the TFT characteristics due to hot carriers, but have no effect on the deterioration of the TFT characteristics due to the self-heating. Therefore, by combining the LDD structure, the GOLD structure, or the multi-gate structure with the division of the channel region width, it is possible to prevent both the deterioration modes due to the hot carriers and the self-heating, thereby realizing the TFT having increased reliability.

A liquid crystal display device of the present invention is arranged so as to include the above-described thin film transistor.

With this arrangement, the TFT having the above-described features is used in the liquid crystal display device. Therefore, it is possible to provide a liquid crystal display device capable of obtaining the reliability as well as capable of minimizing the increase of an area of the liquid crystal display device without narrowing the pixel pitch and without lowering the open area ratio.

A method for manufacturing a thin film transistor of the present invention is arranged so as to have the steps of (A) forming a plurality of channel regions respectively having a channel width of not more than 50 µm, so that a spacing between the channel regions is not less than 3 µm and is smaller than the channel width, (B) forming source regions and drain regions between which each of the channel regions is sandwiched, (C) forming a gate electrode on the channel regions, and (D) connecting the source regions with one another, and connecting the drain regions with one another.

With this method, without lowering the reliability of the TFT of the conventional arrangement, it is possible to provide the TFT of the present invention capable of minimizing the increase of the TFT layout width due to the channel division, namely the increase from the layout width of the undivided single-unit TFT, thereby minimizing the increase of the TFT layout area due to the division.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A thin film transistor, comprising:
   (i) a plurality of channel regions formed under a gate electrode, and
   (ii) source regions and rain regions between which each of said channel regions is sandwiched, said source regions being connected with one another, and said drain regions being connected with one another, wherein:
   said channel regions each respectively have a channel width of not more than 50 µm, and a spacing between said channel regions is not less than 3 µm and is smaller than said channel width.

2. The thin film transistor as set forth in claim 1, wherein:
   said channel width is from 10 µm to 50 µm;
   said spacing between said channel regions is from 3 µm to 10 µm; and
   $WL \leq WL_0 \times 1.2$ is satisfied, where WL is a layout width of said thin film transistor and $WL_0$ is a layout width of a thin film transistor whose channel region has a total size of the channel widths of said respective channel regions.

3. The thin film transistor as set forth in claim 2, wherein: said channel width is from 30 μm to 50 μm.

4. The thin film transistor as set forth in claim 1, wherein: said source regions are connected with one another via a semiconductor layer that composes said source regions; and said drain regions are connected with one another via a semiconductor layer that composes said drain regions.

5. The thin film transistor as set forth in claim 2, wherein: said source regions are connected with one another via a semiconductor layer that composes said source regions; and said drain regions are connected with one another via a semiconductor layer that composes said drain regions.

6. The thin film transistor as set forth in claim 3, wherein: said source regions are connected with one another via a semiconductor layer that composes said source regions; and said drain regions are connected with one another via a semiconductor layer that composes said drain regions.

7. The thin film transistor as set forth in claim 1, wherein: said source regions are connected with one another via a wiring layer that is connected to said source regions; and said drain regions are connected with one another via a wiring layer that is connected to said drain regions.

8. The thin film transistor as set forth in claim 2, wherein: said source regions are connected with one another via a wiring layer that is connected to said source regions; and said drain regions are connected with one another via a wiring layer that is connected to said drain regions.

9. The thin film transistor as set forth in claim 3, wherein: said source regions are connected with one another via a wiring layer that is connected to said source regions; and said drain regions are connected with one another via a wiring layer that is connected to said drain regions.

10. The thin film transistor as set forth in claim 1, having an LDD (Lightly Doped Drain) structure, a GOLD (Gate Overlapped LDD) structure, or a multi-gate structure.

11. The thin film transistor as set forth in claim 2, having an LDD (Lightly Doped Drain) structure, a GOLD (Gate Overlapped LDD) structure, or a multi-gate structure.

12. The thin film transistor as set forth in claim 3, having an LDD (Lightly Doped Drain) structure, a GOLD (Gate Overlapped LDD) structure, or a multi-gate structure.

13. A liquid crystal display device, comprising a thin film transistor that includes (i) a plurality of channel regions formed under a gate electrode, and (ii) source regions and drain regions between which each of said channel regions is sandwiched, said source regions being connected with one another, and said drain regions being connected with one another, wherein:
said channel regions have a channel width of not more than 50 μm, and a spacing between said channel regions is not less than 3 μm and is smaller than said channel width.

14. A method for manufacturing a thin film transistor, comprising the steps of:
forming a plurality of channel regions respectively having a channel width of not more than 50 μm, so that a spacing between said channel regions is not less than 3 μm and is smaller than said channel width;
forming source regions and drain regions between which each of said channel regions is sandwiched;
forming a gate electrode on said channel regions; and
connecting said source legions with one another, and connecting said drain regions with one another.

* * * * *